United States Patent

Onoda et al.

[11] Patent Number: 5,994,769
[45] Date of Patent: Nov. 30, 1999

[54] IC CARD

[75] Inventors: Shigeo Onoda; Jun Ohbuchi; Makoto Omori, all of Tokyo, Japan

[73] Assignee: Mitsubishi Denki Kabushiki Kaisha, Tokyo, Japan

[21] Appl. No.: 08/669,622

[22] Filed: Jun. 24, 1996

[30] Foreign Application Priority Data

Dec. 19, 1995 [JP] Japan .................................... 7-330343

[51] Int. Cl.⁶ ................................................. H01L 23/02
[52] U.S. Cl. ........................... 257/679; 361/728; 257/723
[58] Field of Search .................................. 257/679, 723; 361/728, 737, 752, 785

[56] References Cited

U.S. PATENT DOCUMENTS

| 5,490,043 | 2/1996 | Tan et al. . | |
| 5,780,365 | 7/1998 | Nogami ................................... | 361/737 |
| 5,867,366 | 2/1999 | Klein et al. ............................. | 361/737 |

FOREIGN PATENT DOCUMENTS

| 0584728 | 3/1994 | European Pat. Off. . |
| 0629111 | 12/1994 | European Pat. Off. . |
| 03045397 | 2/1991 | Japan . |
| 04063284 | 5/1992 | Japan . |
| 04077485 | 7/1992 | Japan . |
| 07160837 | 6/1995 | Japan . |

*Primary Examiner*—Carl Whitehead, Jr.
*Assistant Examiner*—Roy Potter

[57] ABSTRACT

An IC card that allows fixing the obverse and reverse metal panels to the plastic frame without using adhesion and allows to make conducting electrically between both the metal panels. The IC card 1 includes an electrical circuit board 3 in which electronic components 4 are incorporated, a connector 5 to be connected to an end portion of the electric circuit board, a frame 2 which constitutes an outer frame of the card and a pair of metal panels 6, 7 which cover an obverse and reverse sides of the card. A plurality of tongues 6c, projecting pieces 7c being able to engage with each other are provided on side edge portions of the metal panels 6,7 respectively, while, a plurality of slits into which the projecting pieces 7c of the lower metal panel 7 are to be pressed are provided in the frame 2, and, the projecting pieces 7c are pressed into the slits, also, corresponding tongues 6c of the upper metal panel 6 are engaged with the projecting pieces 7c respectively in a condition of being subject to elastic force of the metal panels.

18 Claims, 12 Drawing Sheets

IC CARD

FIELD OF THE INVENTION

The present invention relates to an IC card and a manufacturing method thereof.

DESCRIPTION OF THE PRIOR ART

Formerly, in what we call IC card, such a construction is employed widely in general, that inner parts such as an electrical circuit board in which prescribed electronic components etc. being incorporated are arranged in a frame and their obverse and reverse sides are covered by a pair of metal panels.

In the specification, the term of "IC card" indicates card-like or plate-like device being provided with electronic circuits including semiconductor circuits or electric circuits, and cards provided with same basic constitution, being called as various other different names, for example, PC card, modem card, LAN card or electronic card etc., are also included.

Now, an example of a conventional basic construction and a manufacturing method of such an IC card will be concretely explained with reference to the drawings.

FIG. 23 is a disassembled perspective view of a conventional IC card 101. As shown in this figure, said IC card 101 comprises a frame 102 made of plastic which forms an outer frame of a card body, an electric circuit board 103 in which prescribed electronic components etc. 104 are incorporated, a connector 105 to be mounted to an end portion of the electric circuit board 103, and, a pair of metal panels 106,107 which cover respectively an obverse and reverse sides of the IC card 101 including the electric circuit board 103 and the connector 105.

Said connector 105 is for obtaining an electrical connection with equipment (for example, a personal computer etc.) in which the IC card 101 is used.

In assembling the IC card 101, at first, the connector 105 is to be mounted to the end portion of the electric circuit board 103 on which the electronic components etc.104 are mounted, and, the connector 105 is to be connected to the electric circuit board 103 electrically and mechanically, for example, by means of soldering etc., then, a kind of module 108(card module) is constituted. After setting this card module 108 to the frame 102 in the determined position, the metal panels 106,107 are fitted from the obverse and reverse side thereof respectively, and fixed to the frame 102 by means of adhesion.

By this, the IC card 101 having the card module 108 built-in, as shown in FIG. 24 and FIG. 25, is assembled as one body.

That is to say, formerly, an adhesive sheet is placed between each metal panel 106,107 and the frame 102, and, by its adhesive force, each metal panel 106, 107 is fixed to the obverse and reverse sides of the frame 102.

In this case, in order to make the adhesion of the adhesive sheet to generate a required adhesive force, it is required to keep a predetermined temperature (for example, about 150 c), and to apply a predetermined pressure (for example, about 50 Kg) in assembling process.

Therefore, in assembling the IC card 101, a special equipment which can acts a press force in the temperature controlled condition, also, there is a problem that the assembling work takes much time.

With regard to such a problem, for example, in Japanese patent Laid-open Publication No. Hei 3-45397 or Hei 7-160837 (hereinafter, these are named prior art 1, prior art 2), such a construction is disclosed, that a plurality of projections (projecting pieces or tongues) are formed by bending works of side edge portions of each metal panel, while slits corresponding to the projections are provided on the obverse and reverse sides of the plastic frame, and by pressing the corresponding projection into each slit, the metal panels are fixed to the frame on the obverse and reverse sides thereof respectively.

According to such a construction, it is possible to fix each metal panel to the frame without using adhesion, as the result, the above-mentioned special equipment is not required any more, and, the assembling process can be simplified.

By the way, the electronic components etc. mounted on the electric circuit board in the IC card are electrically protected from static electricity impressed from out side by metal panels covering the obverse and reverse sides of the IC card.

And, in order to elevate durability against static electricity from out side, it is known to be effective to connect the obverse and reverse metal panels to each other. That is to say, if both the panels are connected electrically, when static electricity is impressed to one metal panel, it is possible to let the static electricity escape through the other metal panel, therefore the durability against static electricity is improved.

However, in the prior art 1 and prior art 2, the projections provided to each metal panel are pressed into the plastic frame respectively, and, the obverse metal panel and the reverse metal panel do not contact each other, therefore, there is a problem that it is impossible to make conducting between both the metal panels and improve the durability against static electricity.

On the other hand, as a constitution which intends to improve the durability against static electricity by connecting the obverse and reverse metal panels each other, such a construction is known, as disclosed, for example, in Japanese Utility model Laid-open Publication No. Hei 4-63284 or Utility model Laid-open Publication No. Hei 4-77485 (hereinafter, these are named prior art 3, prior art 4), that detentes being able to engage with each other are formed by bending the side edge portions of the obverse and reverse metal panels, while, at corresponding positions to the detentes in the plastic frame, through openings from the obverse side to the reverse side are provided, and by assembling the card, the detentes of the obverse and reverse metal panels are engaged with each other in the through opening, then, the conduction between both the metal panels is obtained However, in this case, the detentes are provided at only a few places (for example 4 per one metal panel), and also, since they are basically to obtain mutual contact by merely engaging, or, to utilize elasticity of the panel detentes for elevating sureness of the contact, an adhesion is required as same as conventional manner in order to fix each metal panel to the plastic frame.

As mentioned above, formerly, in the case that each metal panel is fixed to the frame without using adhesion(prior arts 1,2), both the metal panels could not be conducted electrically, on the other hand, in the case that both the metal panels are conducted electrically (prior arts 3, 4), it was impossible to fix each panel to the frame without adhesion.

In other words, the actual situation is that it was impossible to achieve, at a time, simplifications of the construction of the IC card and the manufacturing process thereof and improvement of the durability against static electricity.

SUMMARY OF THE INVENTION

The present invention has been developed to solve the above-mentioned conventional problems, and has objects of providing an IC card and a manufacturing method thereof, which allow to fix the obverse and reverse metal panels to the plastic frame without using adhesion, and at a time, allow to make conducting electrically between both the metal panels.

Thus, according to an aspect of the present invention which is developed to achieve the above-mentioned objects, there is provided an IC card comprising an electrical circuit board in which prescribed electronic components etc. are incorporated, a connector to be connected to an end portion of the electric circuit board, a frame which constitutes an outer frame of the card and a pair of metal panels which cover an obverse and reverse sides of the card, wherein; a plurality of projections being able to engage with each other are provided on side edge portions of each metal panels respectively, while, a plurality of slits into which the projections of whichever one metal panel are to be pressed are provided to the frame, and, the projections of said one metal panel are pressed into the slits, also, corresponding projections of the other metal panel are engaged with the projections of said one metal panel respectively in a condition of being subject to elastic force of the metal panels.

In the above-mentioned IC card according to the aspect of the invention, since the projections of said one metal panel are pressed into the slits provided to the frame, said one metal panel is fixed by pressing into the frame by means of the pressing force. And, since corresponding projections of the other metal panel are engaged with the projections of said one metal panel respectively in a condition of being subject to elastic force of the metal panels, the other metal panel is secured by engaging to said one metal panel by means of the elastic force. In other words, both the metal panels can be secured to the frame without using adhesion. As the result, the adhesion itself and special equipments to be used in adhesive process are not required any more, and, the assembling process can be much simplified, by these, a reduction of the manufacturing cost of the IC card can be achieved.

Also, in this case, since both the metal panels are conducted electrically due to mutual engagements of their projections, the durability against static electricity impressed from out side can be elevated still higher.

That is to say, it comes to be possible to secure the obverse and reverse metal panels without using adhesion, and at a time, to conduct both the metal panels electrically, accordingly, reduction of the manufacturing cost and improvement of the endurance against static electricity can be achieved at a time.

Further, in the above-mentioned IC card, it is preferable that said one metal panel covers the reverse side of the IC card and the other metal panel covers the obverse side of the IC card, and, the projections of the other metal panel are engaged with the corresponding projections of said one metal panel from out side.

In this case, since the projections of the other metal panel covering the obverse side of the IC card are engaged with the corresponding projections of said one metal panel on reverse side of the IC card from out side, the engaging portions between both the projections are covered by the other metal panel, accordingly they can not be observed easily from the obverse side. In other words, it is possible to improve the appearance of the obverse side which attracts people's attention.

Still further, in the above-mentioned IC card, it is preferable that a notch opening in a direction along a plane of the IC card is provided to each projection of said one metal panel, and, each projection of the other metal panel engages with the notch, by sliding the other metal panel along a corresponding surface of the frame.

In this case, since the engagement between the projections of both the metal panels are obtained by sliding the other metal panel along the corresponding surface of the frame, the assembling work of both the metal panels can be performed relatively easily.

Still further, in the above-mentioned IC card, it is preferable that the notch opens toward a reverse side of a portion of the IC card at which the connector is positioned, and, a maximum slide length of the other metal panel is determined to be less than a width of the connector.

In this case, since the notch opens toward the reverse side of the portion of the IC card at which the connector is positioned, and the maximum slide length of the other metal panel is determined to be less than a width of the connector, the side edge portion of the connector side in the other metal panel can be slid on the same plane (i.e the surface of the connector) before and after the slide motion, and, it comes to be possible to ensure a smooth slide motion without scratches.

Still further, in the above-mentioned IC card, it is preferable that an engaging portion having tapered parts is provided respectively to each projection of both the metal panels.

In this case, since the engaging portion having tapered parts is provided respectively to each projection of both the metal panels, when they engage with each other, they can slide mutually in the condition that the tapered parts thereof are combined, and, they can be engaged surely as scatters in mutual dimensions and shapes are being absorbed.

Still further, in the above-mentioned IC card, it is preferable that each projection of said one metal panel is formed to be a waisted configuration having a neck portion, and the tapered part of the engaging portion provided to each projection of the other metal panel engages with the neck portion.

In this case, since each projection of said one metal panel is formed to be a waisted configuration having a neck portion, and the tapered part of the engaging portion provided to each projection of the other metal panel engages with the neck portion, when they engage with each other, it is possible to obtain an engaged condition by acting the elastic force of the metal panels, after inserting each projection of said one metal panel into the wide area of the tapered part. And, it is possible to engage for fixation of the other metal panel to said one metal panel without applying immoderate force on the other metal panel.

Still further, in the above-mentioned IC card, it is preferable that, on the side edge portions of each metal panel, bent portions formed along the side edge by bending a panel material at a predetermined angle are provided, and, the projections of each metal panel are formed so that they project additionally from an edge of the bent portion.

In this case, since on the side edge portions of each metal panel, bent portions formed along the side edge by bending a panel material at a predetermined angle are provided, it comes to be possible to raise the rigidity of each metal panel, in comparison with the case that they are designed to be merely flat plate.

Still further, in the above-mentioned IC card, it is preferable that the bent portions of both the metal panels are bent by mutually different angles, and the projections of each metal panel project additionally from the edge of the bent portions in the same plane.

In this case, since the bent portions of both the metal panels are bent at mutually different angles, and the projections of each metal panel project additionally from the edge of the bent portions in the same plane, the bent portions and the projections are in the same plane, therefore, in bending each metal panel, it is not necessary to bend the panel material in divided two stages, and working process can be simplified.

Still further, in the above-mentioned IC card, it is preferable that concavities which contain the engaging portion between the projections of both the metal panel and convexities which can support the other metal panel in a engaging condition thereof.

In this case, since the concavities which contain the engaging portion between the projections of both the metal panel and the convexities which can support the other metal panel in the engaging condition thereof, it is possible to engage each projection of both the metal panels mutually without any trouble, and to ensure effectively the supporting rigidity for the other metal panel in that engaging condition.

Furthermore, according to another aspect of the present invention, there is provided an manufacturing method of an IC card comprising an electrical circuit board in which prescribed electronic components etc. are incorporated, a connector to be connected to an end portion of the electric circuit board, a frame which constitutes an outer frame of the card and a pair of metal panels which cover an obverse and reverse sides of the card, comprising: a step of forming a card module by mounting the connector to the electric circuit board; a step of fixing by pressing whichever one metal panel into the frame, by pressing a plurality of projections provided to side edge portions of said one metal panel into slits provided to the frame; a step of setting the card module to the frame into which said one metal panel is fixed by pressing; and, a step of combining an other metal panel to said one metal panel fixed by pressing into the frame after the card module being set to the frame, and engaging for securing the other metal panel to said metal panel, by engaging a plurality of projections provided to side edge portions of the other metal panel with corresponding projections of said metal panel in a condition of being subject to elastic force of the metal panels.

In the above-mentioned manufacturing method of an IC card according to the aspect of the invention, by pressing a plurality of projections provided to the side edge portions of said one metal panel into the slits provided to the frame, said one metal panel is fixed by being pressed into the frame. And, since corresponding projections of the other metal panel are engaged with the projections of said one metal panel respectively in a condition of being subject to elastic force of the metal panels, the other metal panel is secured by engaging to said one metal panel by means of the elastic force. In other words, both the metal panels can be fixed to the frame without using adhesion. As the result, the adhesion itself and special equipments to be used in adhesive process are not required any more, and, the assembling process can be much simplified, by these, a reduction of the manufacturing cost of the IC card can be achieved.

Also, in this case, since both the metal panels are conducted electrically due to mutual engagements of their projections, the durability against static electricity impressed from out side can be elevated still higher.

That is to say, it comes to be possible to secure the obverse and reverse metal panels without using adhesion, and at a time, to conduct both the metal panels electrically, accordingly, reduction of the manufacturing cost and improvement of the endurance against static electricity can be achieved at a time.

Still further, in the above-mentioned manufacturing method of an IC card, it is preferable that, in engaging for securing the other metal panel to said one metal panel, each projection of the other metal panel is to be engaged respectively with a corresponding projection of said one metal panel, by incurvating the other metal panel toward a predetermined direction within its elasticity.

In this case, since in engaging for securing the other metal panel to said one metal panel, each projection of the other metal panel is to be engaged respectively with a corresponding projection of said one metal panel, by incurvating the other metal panel toward a predetermined direction within its elasticity, it is possible to act elastic force on the engaging portion between each projection relatively easily and surely.

BRIEF DESCRIPTION OF THE DRAWINGS

These and other objects, features and advantages of the present invention will become clear from the following description taken in conjunction with the preferred embodiment with reference to the accompanying drawings, and in which.

DETAILED DESCRIPTION OF THE PREFERRED EMBODIMENT

Hereinafter, preferred embodiments of the present invention will be explained in detail with reference to attached drawings.

At first, a first embodiment of the invention shown in FIG. 1–FIG. 8 will be explained.

Figure 1:
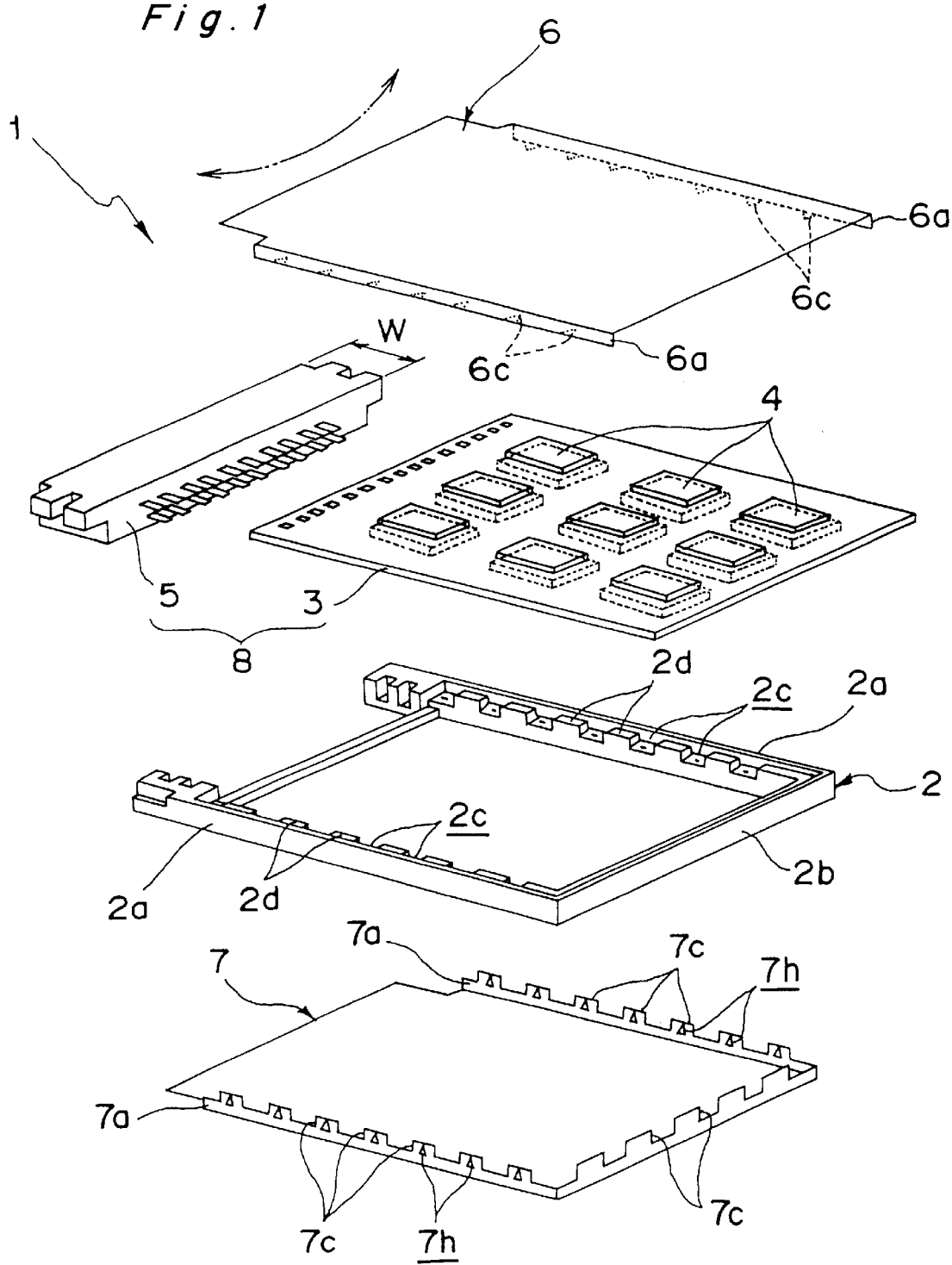
FIG. 1 is a disassembled perspective view of the IC card in a first embodiment of the present invention.

FIG. 1 is a disassembled perspective view of an IC card 1 in accordance with the present invention. As shown in this figure, said IC card 1 comprises a frame 2 made of plastic which forms an outer frame of a card body, an electric circuit board 3 in which prescribed electronic components etc.4 are incorporated, a connector 5 to be mounted to an end portion of the electric circuit board 3, and, a pair of metal panels 6,7 which cover respectively an obverse and reverse(upper and lower) sides of the IC card 1 including the electric circuit board 3 and the connector 5.

Said connector 5 is for electrical connection signal communication with an equipment(for example, a personal computer etc.) in which the IC card 1 is used, and locates on one side face(front side face) of the IC card 1. Also, the electronic components etc.4 and the connector 5 are electrically and mechanically connected to the electric circuit board 3 by means of for example soldering etc. Thus, the electric circuit board 3 to which the electronic components etc.4 and connector 5 are mounted as one body is named card module 8.

In assembling the IC card 1, at first, the connector 5 is to be mounted to an end portion of the electric circuit board 3 on which the electronic components etc. 4 are mounted, and, the connector 5 is to be connected to the electric circuit board 3 electrically and mechanically, for example, by means of soldering etc., then, the card module 8 is constituted. And, by a method which will be explained in detail later, one (the lower side in the figure) metal panel 7 is pressed into the plastic frame 2 for fixation. And, the card module 8 is to be set in the plastic frame 2, and at last, the other (the upper side in the figure) metal panel 6 is combined with the frame 2 in which the card module 8 is set, and, engaged for fixation with the lower metal panel 7 being pressed into the frame 2 for fixation, by a method which will be explained later.

Figure 2:
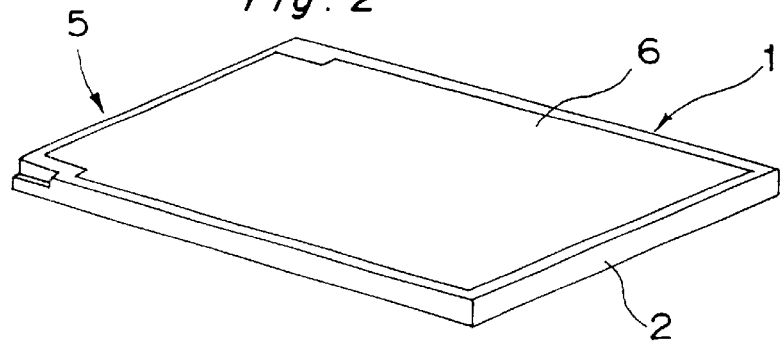
FIG. 2 is an overall perspective view of the IC card in the first embodiment of the present invention.
Figure 3:
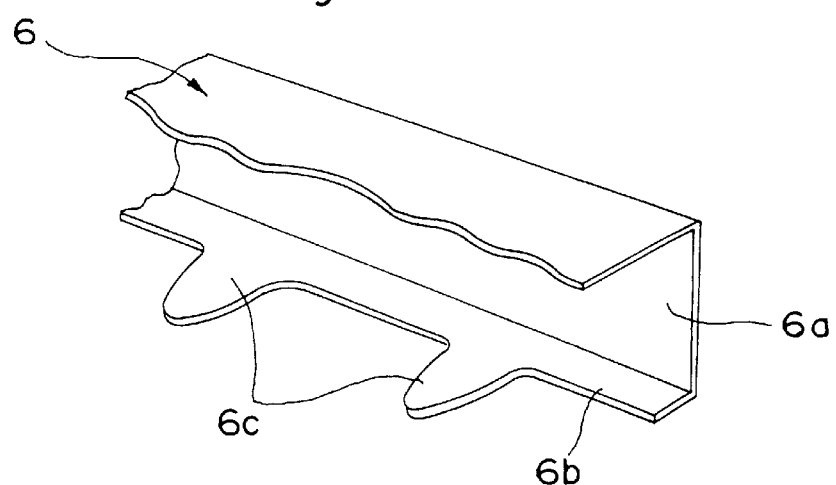
FIG. 3 is an enlarged perspective view of tongues of an upper metal panel of the IC card in the first embodiment of the present invention.

As mentioned above, one IC card 1 having the card module 8 built-in is assembled as one body, as shown in FIG. 2, without using adhesion.

Then, the card module 8 of the IC card 1 is contained and hold in the plastic frame 2, and the obverse and reverse thereof are covered by the pair of the metal panel 6,7, and, electronic components etc.4 of the card module 8 are electrically protected, by those metal panels 6,7, from static electricity impressed from out side.

In the next place, the pressing for fixation the lower metal panel 7 of the lower metal panel 7 into the frame 2 and the engaging for securing the upper metal panel 6 with the lower metal panel 7 will be explained.

In the embodiment, on each longitudinal side edge portion of the upper metal panel 6, a bent portion 6a formed, by bending the panel material at about 90 degrees, to L-shape in cross sectional configuration is provided respectively, and, at a plurality of places (seven places in this embodiment) of longitudinal side edge portion of said bent portion 6a, a plurality of projections 6c (tongues) are formed by bending the side edge portion inwardly further at about 90 degrees. As understood well from FIG. 3, more preferably, those tongues 6c project inwardly respectively, so that they form generally triangles in plan view, from a basic edge portion 6b formed by bending the side edge portion of said bent portion 6a inwardly further at about 90 degrees.

Figure 4:
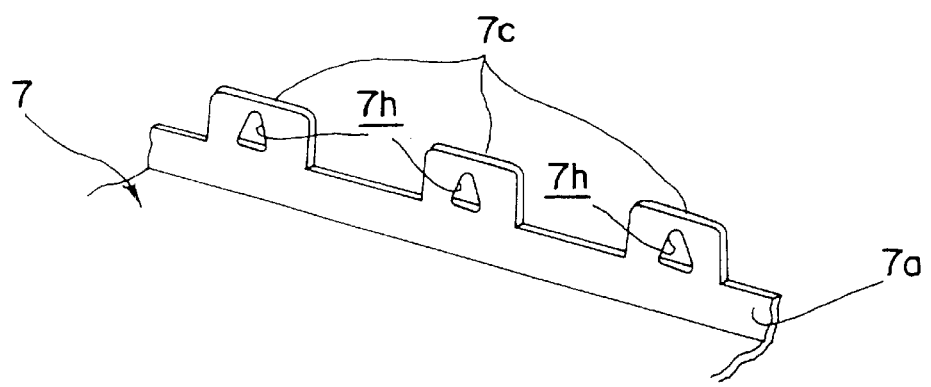
FIG. 4 is an enlarged perspective view of projecting pieces of a lower metal panel of the IC card in the first embodiment of the present invention.

On the other hand, also regarding to the lower metal panel, on each longitudinal side edge portion thereof, a bent portion 7a formed, by bending the panel material at about 90 degrees, to L-shape in cross sectional configuration is provided respectively, and, at a plurality of places corresponding to the tongues 6c of the upper metal panel 6, generally rectangular projections 7c (projecting pieces) project upwardly from the bent portion 7a are provided.And, as understood well from FIG. 4, an generally triangle engaging opening 7h with which engages the tongue 6c of the upper metal panel 6 is formed in each projecting piece.

In the lower metal panel 7, more preferably, also on the rear side edge portion, a bent portion 7a of L-shape in cross sectional configuration as same as said bent portion 7a and a plurality of projecting pieces 7c are formed, however, the above-mentioned engaging openings 7h are not provided in the projecting pieces 7c of this portion.

Figure 5:
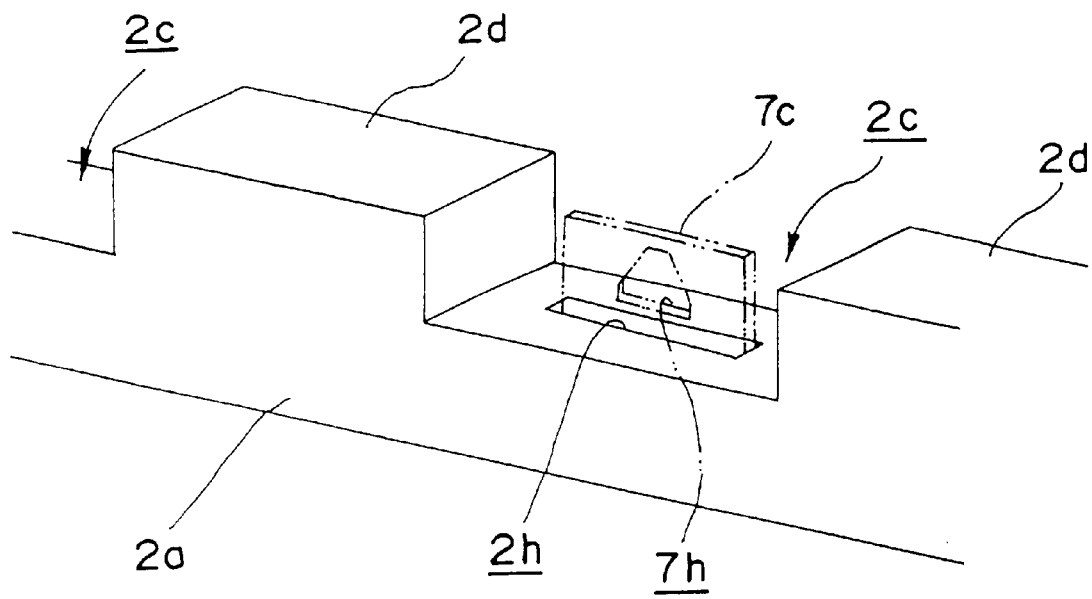
FIG. 5 is an enlarged perspective view of concavities and slit of a frame in the first embodiment of the present invention.

Also, on longitudinal frame portions 2a along the longitudinal direction of the plastic frame 2, predetermined depth of concavities 2c are provided at a plurality of places corresponding to the projecting pieces 7c of the lower metal panel 7, and, as shown in detail in FIG. 5, in the bottom wall of each concavity 2c, a slit 2h through which a corresponding projecting piece 7c passes in a condition of being pressed in.

The upper surface of a convexity 2d adjacent to each concavity 2c in the longitudinal frame portion 2a constitutes a supporting surface for the upper metal panel 6 in assembling the IC card 1.

In this embodiment, the length of said each slit 2h is determined to be less than the corresponding projecting piece 7c by predetermined (very slight) length, and, by enforcing each projecting piece 7c to pass through each corresponding slit 2h by external force, each projecting piece 7c (therefore, the lower metal panel 7) is pressed for fixation to the frame 2 with a certain pressing force. Also, in this condition of being pressed in, the position of the engaging opening 7h and the depth of the concavity 2c are determined so that the engaging opening 7h formed in each projecting piece 7c is positioned upward than the bottom wall of each concavity 2c.

It is not shown concretely in the figures, but, more preferably, regarding to transverse frame portions 2b of the frame 2, holes into which each corresponding projecting piece 7c is to be pressed in are provided. However, regarding to this portion, any concavity is not provided in the transverse frame its self, also, each hole does not open through upwardly, therefore, each projecting piece 7c is to be buried in the transverse frame portion 2b by pressing.

Figure 6:
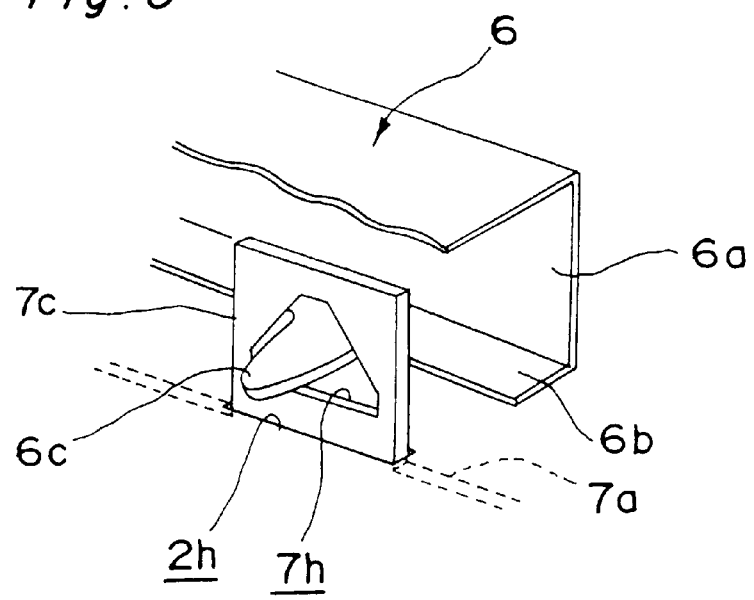
FIG. 6 is an enlarged perspective view illustrates an engaging condition of tongue and projecting piece in the first embodiment of the present invention.

After pressing for fixation the lower metal panel 7 into the plastic frame 2, as mentioned above, in engaging for securing the upper metal panel 6 with the lower metal panel 7, in the final procedure of assembling the IC card 1, as shown by an arrow of virtual lines in FIG. 1, a predetermined external force is applied on the upper metal panel 6. And, the upper metal panel is incurvated within the elasticity of the material thereof in such a manner as lifting up each longitudinal side edge portion against the middle area, in other words, as expanding the middle area downwardly, and by this, the distance between the tongues 6c of both the side edge portions is enlarged. And, in this incurvated condition, as shown in FIG. 6, each tongue 6c is to be engaged with the corresponding engaging opening 7h of the projecting piece 7c from out side of the projecting piece 7c of the lower metal panel 7, and thereafter, the external force applied on the upper metal panel 6 is to be released.

Thus, each tongue 6c engages with the engaging opening 7h of the corresponding each projecting piece 7c, and, the direct contact between the upper and lower metal panels 6,7 is achieved. Furthermore, in this case, after releasing the external force applied on the upper metal panel 6, by the elastic force of the upper metal panel 6 itself, each tongue 6c is subject to a moment in the direction of lifting up the corresponding projecting piece 7c. By this, each tongue 6c does not merely touch by engaging with corresponding projecting piece, but also be connected firmly by a certain biassing force (elastic force of the whole upper metal panel 6). And, it is secured by the engagement without a shake.

Then, a tapered part of each tongue 6c is combined with a tapered part of the engaging opening 7h in a corresponding projecting piece 7c, and they can slide mutually. By this, they can be engaged surely as scatters in mutual dimensions and shapes are being absorbed.

Figure 7:
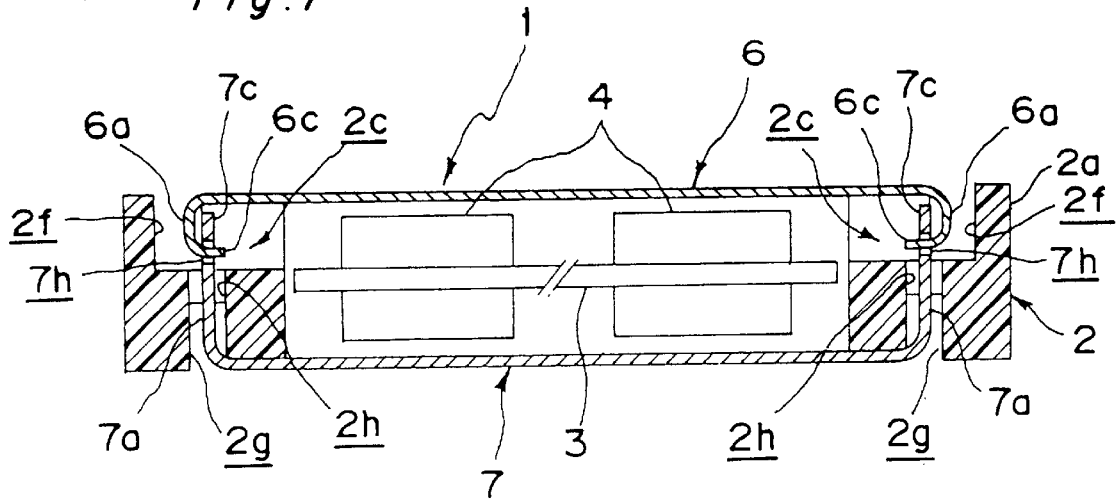
FIG. 7 is a vertical cross-sectional view of the IC card illustrates an engaging condition of tongue and projecting piece in the first embodiment of the invention.

As shown in FIG. 7, the engaging portion between them is contained in each concavity 2c formed in the longitudinal frame portion 2a of the frame 2. Also, as shown in FIG. 8, the reverse side of the upper metal panel 6 is supported by the upper surface of the convexity 2d adjacent to the concavity 2c in the longitudinal frame portion 2a.

Figure 8:
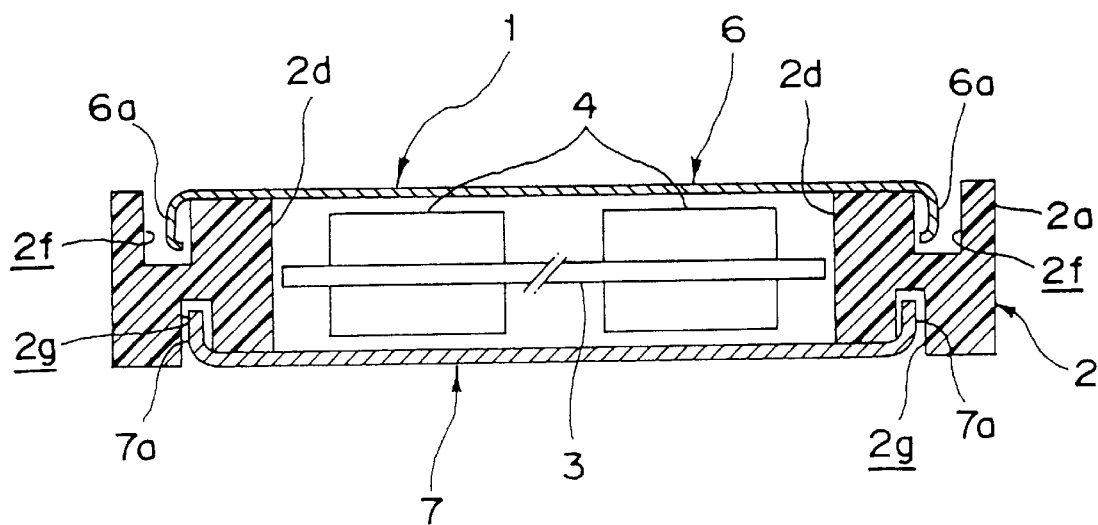
FIG. 8 is a vertical cross-sectional view of the IC card illustrates an supported condition of the upper metal panel being supported by the frame in the first embodiment of the invention.

As shown in FIG. 7 and FIG. 8, in left and right longitudinal frame portion 2a of the plastic frame 2, a groove 2f for containing the bent portion 6a of the upper metal panel 6 and a groove 2g for containing the bent portion 7a of the lower metal panel 7 are provided in the longitudinal direction.

As explained above, according to the embodiment of the invention, since the projecting piece 7c of the lower metal panel 7 is pressed into each slit 2h provided to the plastic frame 2, the lower metal panel 7 is fixed by pressing into the frame 2 by means of the pressing force. And, since corresponding tongue 6c of the upper metal panel 6 is engaged with each projecting piece 7c of the lower metal panel 7 respectively in a condition of being subject to elastic force of the metal panels, the upper metal panel 6 is secured by engaging to the lower metal panel 7 by means of the elastic force. In other words, both the metal panels 6,7 can be secured to the frame 2 without using adhesion.

As the result, the adhesion itself and special equipments to be used in adhesive process are not required any more, and, the assembling process can be much simplified, by these, a reduction of the manufacturing cost of the IC card can be achieved.

Also, in this case, since both the metal panels 6,7 are conducted electrically due to mutual engagements of their projections(tongues 6c and projecting pieces 7c), the durability against static electricity impressed from out side can be elevated still higher.

That is to say, it comes to be possible to secure the obverse and reverse metal panels 6, 7 without using adhesion, and at a time, to conduct both the metal panels 6,7 electrically, accordingly, reduction of the manufacturing cost and improvement of the endurance against static electricity can be achieved at the same time.

Furthermore, in this case, since the tongues 6c of the upper metal panel 6 covering the upper side(obverse side) of the IC card 1 are engaged with the corresponding projecting pieces 7c of the lower metal panel 7 covering the lower side(reverse side) of the IC card 1 from out side, the engaging portions between both the projections 6c,7c are covered by the upper metal panel 6, accordingly, they can not be observed easily from the obverse side. In other words, it is possible to improve the appearance of the obverse side which attracts people's attention.

Also, in this case, since the engaging portion having tapered parts is provided respectively to each projection (tongue 6c, projecting piece 7c) of both the metal panels 6,7, when they engage with each other, they can slide mutually in the condition that the tapered parts thereof are combined, and, they can be engaged surely as scatters in mutual dimensions and shapes are being absorbed.

Further, in this case, since on the side edge portions of each metal panel 6,7, bent portions 6a,7a formed along the side edge by bending a panel material at a predetermined angle (about 90 degrees) to L-shape in cross-sectional configuration are provided, it comes to be possible to raise the rigidity of each metal panel 6,7, in comparison with the case that they are designed to be merely flat plate.

Furthermore in this case, since the concavities 2c which contain the engaging portion between the projections (tongues 6c, projecting pieces 7c) of both the metal panel 6,7 and the convexities 2d which can support the upper metal panel 6 in the engaging condition thereof, it is possible to engage each projection (tongue 6c, projecting piece 7c) of both the metal panels 6,7 mutually without any trouble, and to ensure effectively the supporting rigidity for the upper metal panel 6 in that engaging condition.

Also, in this case, since in engaging for securing the upper metal panel 6 to the lower metal panel 7, each tongue 6c of the upper metal panel 6 is to be engaged respectively with a corresponding projecting piece 7c of the lower metal panel 7, by incurvating the upper metal panel 6 toward a predetermined direction within its elasticity, it is possible to act elastic force on the engaging portion between the projections (tongue 6c, projecting piece 7c) relatively easily and surely.

In the next place, a second embodiment of the invention, illustrated in FIG. 9–FIG. 13, will be explained.

In the explanation below, the same components as in the first embodiment are designated by same reference numerals, and duplicated descriptions are eliminated.

Figure 9:
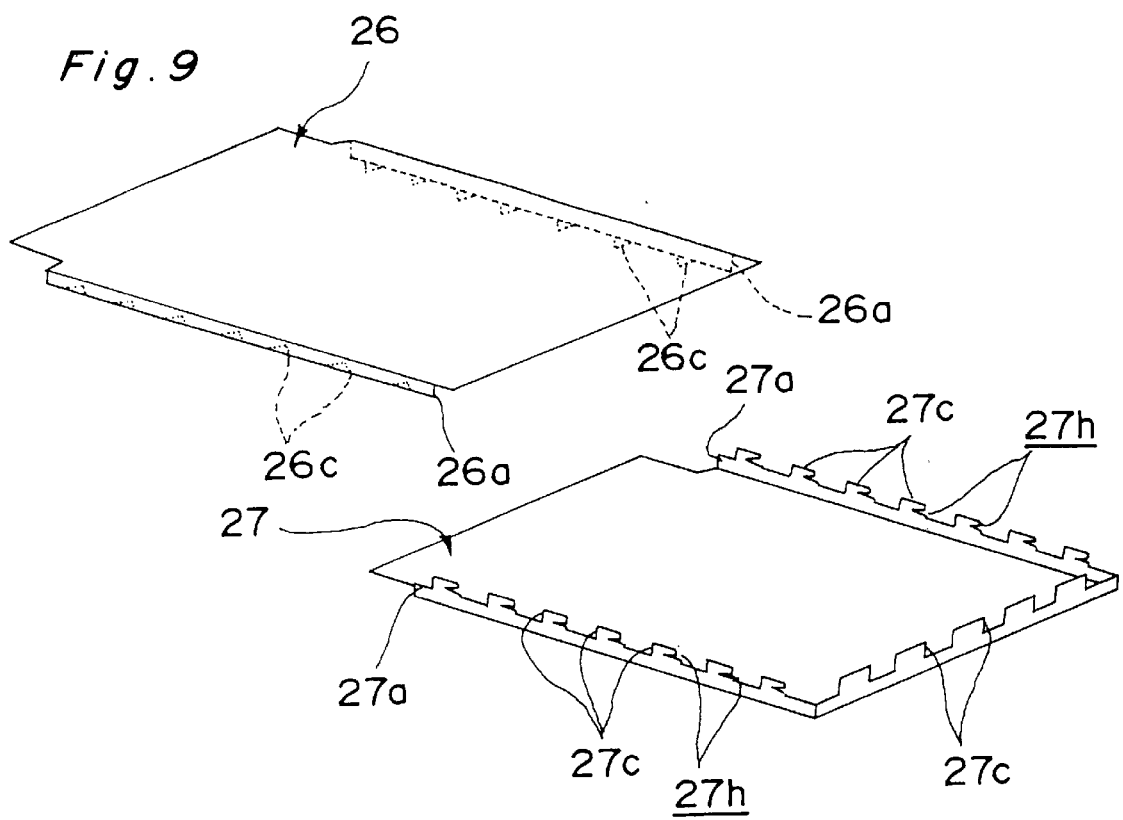
FIG. 9 is an overall perspective view of upper and lower metal panels of the IC card in a second embodiment of the invention.

In this embodiment, as shown in FIG. 9, in a bent portion 26a of L-shape in a cross-sectional configuration formed on each longitudinal side edge portion of an upper metal panel 26, a plurality of(for example 7 pieces in this embodiment) generally triangle tongues 26c similar to those in the first embodiment are formed.

On the other hand, in bent portion 27a of L-shape in a cross sectional configuration formed on each longitudinal side edge portion of a lower metal panel 27, a plurality of projecting pieces 27c are provided at corresponding positions to the tongues 26c.

Figure 10:
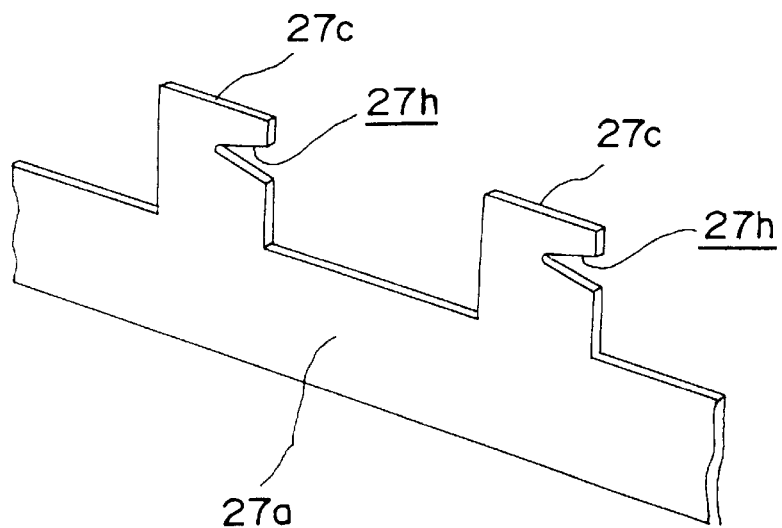
FIG. 10 is an enlarged perspective view of projecting pieces of a lower metal panel of the IC card in the second embodiment of the present invention.

In this embodiment, as shown in FIG. 10, tapered notches 27h which open toward the rear side are provided to those projecting pieces 27c respectively, in order to engage the tongues 26c of the upper metal panel 26.

Also, in a longitudinal frame portions 22a of the plastic frame 22 (refer to FIG. 11), concavities, slits, convexities etc. which have the same functions as those in the first embodiment are provided, though they are not shown concretely in the figure.

And, the lower metal panel 27 is fixed to the frame 22, by pressing each projecting piece 27c of the lower metal panel 27 into the slit 22h (refer to FIG. 12) of the frame 22, in the same manner as in the first embodiment.

Figure 11:
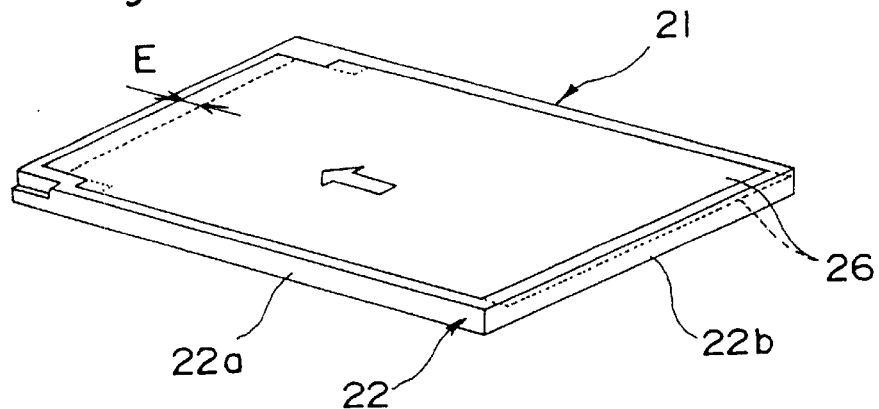
FIG. 11 is a overall perspective view illustrates an assembled condition of the IC card in the second embodiment of the present invention.
Figure 12:
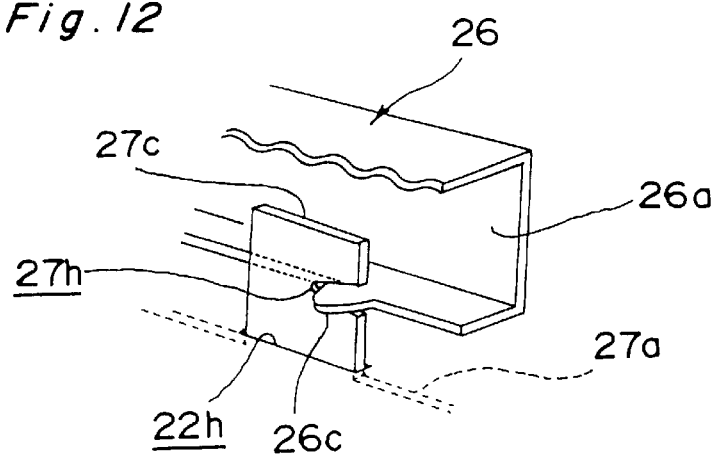
FIG. 12 is an enlarged perspective view illustrates an engaging condition of tongue and projecting piece in the second embodiment of the present invention.

In this embodiment, as shown in FIG. 11, in the final step of assembling the upper metal panel 26, by sliding the upper metal panel 26 from the rear side toward the front side of an IC card body 21 (refer to an arrow in FIG. 11), in the condition of setting the upper metal panel 26 on the frame 22(refer to broken lines in FIG. 11), the tongues 26c of the upper metal panel 26 are engaged with the notches 27h in the corresponding projecting pieces 27c of the lower metal panel 27, as shown in FIG. 12. By this, the upper metal panel 26 is secured to the lower metal panel 27.

In this case, the concavities formed in the longitudinal frame portions 22a of the frame 22 are designed to be so long in the longitudinal direction of the IC card 21 that the upper metal panel 26 can slide without any trouble.

Figure 13:
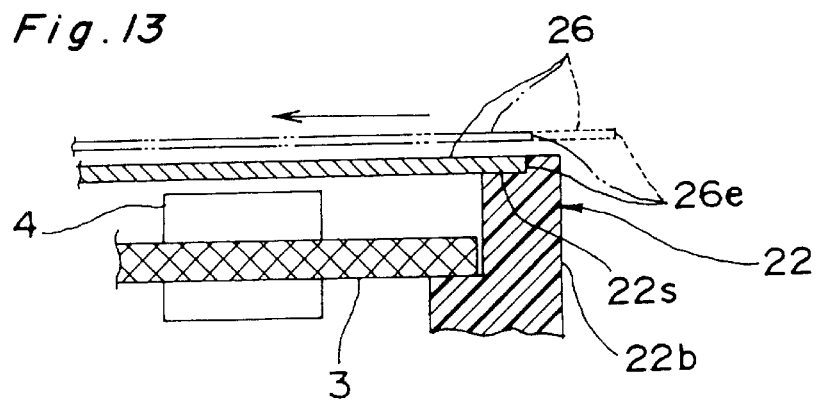
FIG. 13 is an enlarged vertical cross-sectional view of a rear end portion of the frame in the second embodiment of the present invention.

In this embodiment, as shown in FIG. 13, a stair 22s is formed in a upper face of a transverse frame portion 22b of the frame 22, and the rear end 26e of the upper metal panel 26 is at the position protruding by a predetermined(very slight) from a vertical wall of the stair 22s in the transverse frame portion 22b, and, by applying an external force toward the front side on the upper metal panel 26, the rear end 26e of the upper metal panel 26 is enforced to press into the stair 22s. Therefore, in this case, the upper metal panel 26 is incurvated in the longitudinal direction of the IC card 21.

As the result, each tongue 26c of the upper metal panel 26 does not merely touch by engaging with each corresponding projecting piece 27c, but also be secured firmly by a certain biassing force (elastic force of the upper metal panel 26) acting in the longitudinal direction of the card.

Then, since the tapered part of each tongue 26c can slide along the tapered part of the notch 27h of the corresponding projected piece 27c, they can engage surely as scatters in mutual dimensions and shapes are being absorbed. And, the dimensions and required accuracy of each portion are determined so that a predetermined biassing force is obtained in that engaged condition.

Also, in this embodiment, the maximum slide length E (refer to FIG. 11) in sliding the upper metal panel 26 from rear side to front side is determined to be less than the width W(refer to FIG. 1) of the connector 5.

By this, the front end portion of the upper metal panel 26 slides on the same plane (upper surface of the connector 5) before and after of the slide motion, and, it comes to be possible to ensure a smooth slide motion without scratches.

As explained above, in this embodiment, the same advantages as those in the first embodiment are obtained basically, and especially, since the engagement between the projections (tongues 26c, projecting pieces 27c) of both the metal panels 36,37 are obtained by sliding the upper metal panel 26 along the upper surface of the frame 22, the assembling work of both the metal panels 26,27 can be performed relatively easily.

In the next place, a third embodiment of the invention, illustrated in FIG. 14–FIG. 18, will be explained.

Figure 14:
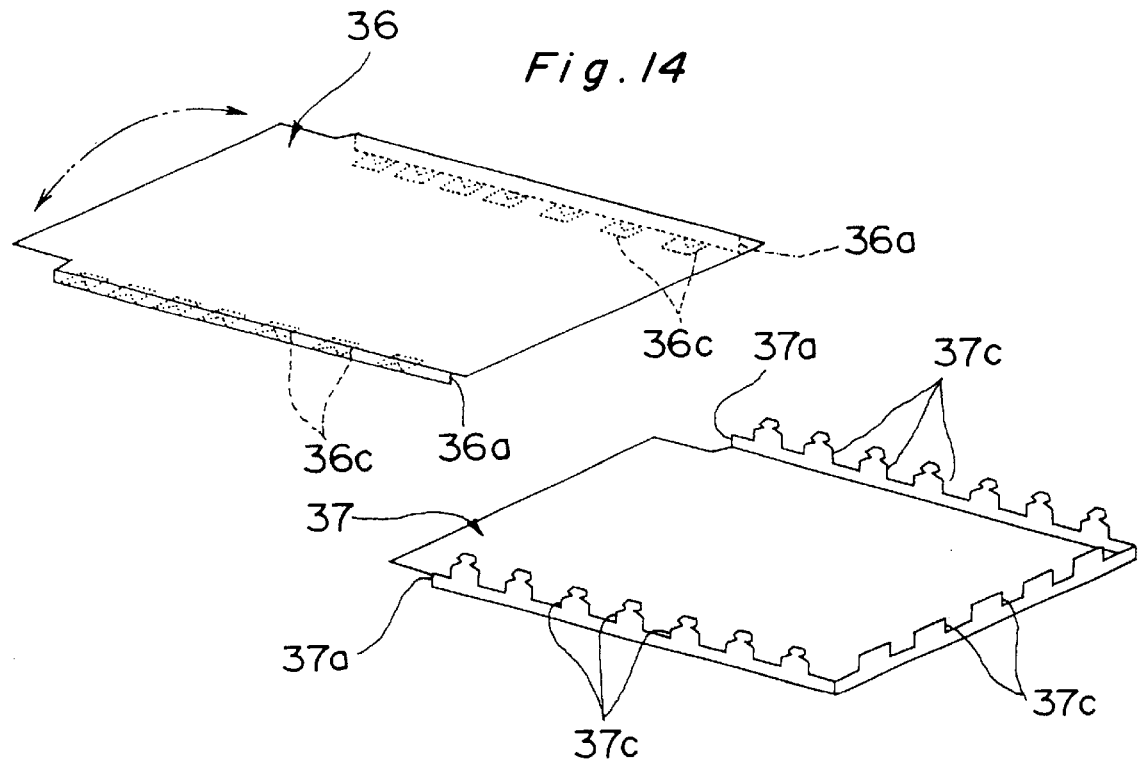
FIG. 14 is an overall perspective view of upper and lower metal panels of the IC card in a third embodiment of the invention.

As shown in FIG. 14, in this embodiment, on each longitudinal side edge portion of the upper metal panel 36, a bent portion 36a formed by bending the panel material at about 90 degrees to L-shape in cross sectional configuration is provided respectively, and, tongues 36c are formed at a plurality of places (seven places in this embodiment), by bending the longitudinal side edge portion of said bent portion 36a inwardly further at about 90 degrees.

Figure 15:
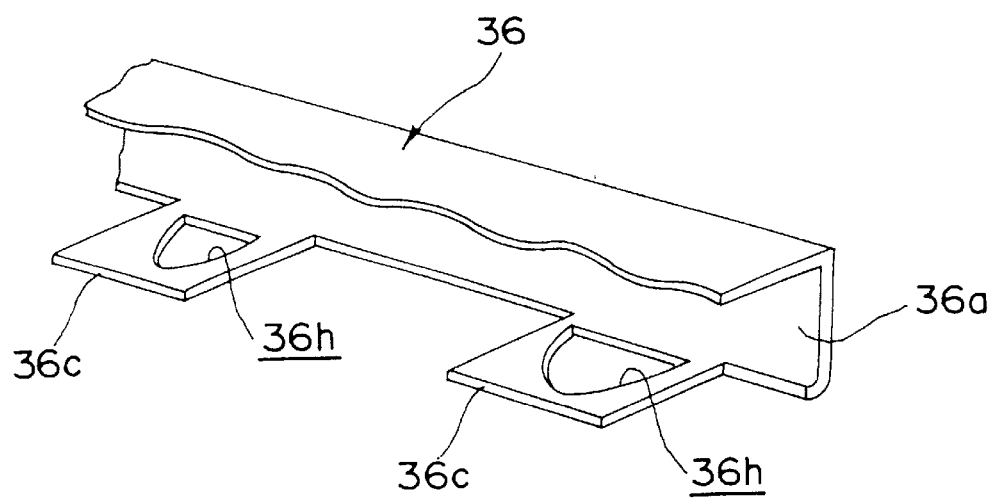
FIG. 15 is an enlarged perspective view of tongues of an upper metal panel of the IC card in the third embodiment of the present invention.

As understood well from FIG. 15, those tongues 36c are respectively projecting inwardly so that they form generally rectangles in plan view, from the side edge portion of said bent portion 36a. And, triangle engaging openings 36h are formed in those tongues 36c in order to engage the projecting pieces 37c of the lower metal panel 37.

On the other hand, in a bent portion 37a of L-shape in a cross-sectional configuration formed on each longitudinal side edge portion of the lower metal panel 37, at a plurality of places corresponding to the tongues 36c of the upper metal panel 36, projecting pieces 37c which project upwardly from the bent portion 37a are provided.

Figure 16:
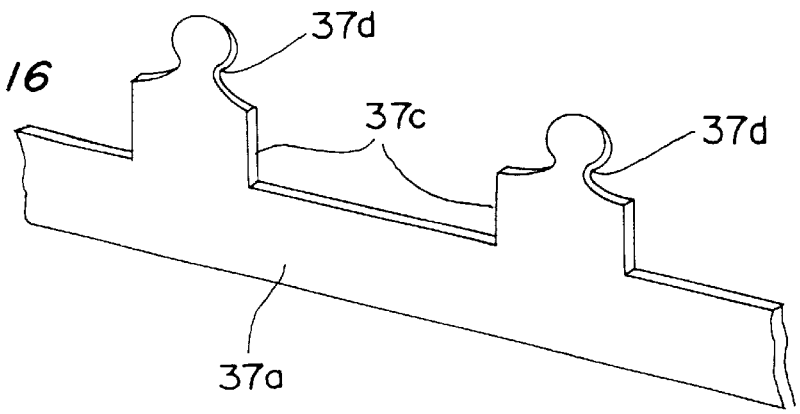
FIG. 16 is an enlarged perspective view of projecting pieces of a lower metal panel of the IC card in the third embodiment of the present invention.

In this embodiment, as shown in detail in FIG. 16, the upper portion of the projecting piece 37c is formed to be waisted configuration, and, the neck portion 37d thereof can engage with the engaging opening 36h provided to the tongue 36c of the upper metal panel 36.

In the lower metal panel 37, more preferably, a bent portion 37a of L-shape in cross sectional configuration as same as said bent portion 37a and a plurality of projecting pieces 37c are formed also on rear side edge portion, however, the above-mentioned waisted configuration are not provided in the projecting pieces 37c of this portion, and they are formed as merely rectangular configuration.

Also, the plastic frame of the IC card according to this embodiment has the same constitution as that in the first embodiment, although it is not shown concretely in the figure.

And, by pressing each projecting piece 37c of the lower metal panel 37 into the slit 2h of the frame 2(refer to FIG. 17, FIG. 18) in the same manner as in the first embodiment, the lower metal panel 37 is fixed to the frame 2.

Figure 17:
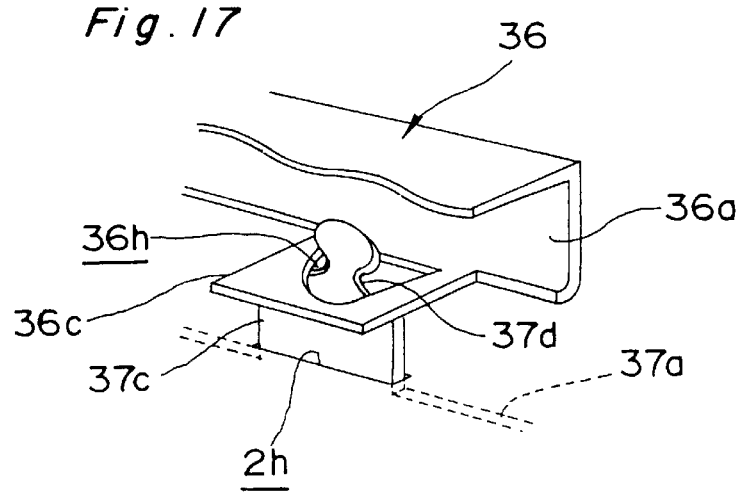
FIG. 17 is an enlarged perspective view illustrates an engaging condition of tongue and projecting piece in the third embodiment of the present invention.

After pressing the lower metal panel 37 into the plastic frame 2 for fixation, in engaging the upper metal panel 36 for securing to the lower metal panel 37 in the final step of assembling the IC card 31, as shown by an arrow of virtual lines in FIG. 14, by applying a predetermined external force on the upper metal panel 36, the upper metal panel is incurvated within the elasticity of the material thereof, in such a manner as pressing down each longitudinal side edge portions against the middle area, in other words, as expanding the middle area upwardly. By this, the distance between the tongues 36c of both the side edge portions is narrowed. And, in this incurvated condition, as shown in FIG. 17, each projecting piece 37c of the lower metal panel 37 is to be engaged with the engaging opening 36h of the corresponding tongues 36c of the upper metal panel 36.

Then, since the upper metal panel 36 is incurvated as mentioned above, the projecting pieces 37c of the lower metal panel 37 are inserted smoothly into the wide portions in the engaging openings 36h in the tongues 36c of the upper metal panel 36, the engaging work can be performed easily. And thereafter, the external force applied on the upper metal panel 36 is to be released.

Thus, each projecting piece 37c of the lower metal panel 37 engages with the engaging opening 36h in the corresponding tongue 36c, and, the direct contact between the upper and lower metal panels 36, 37 is achieved.

Furthermore, in this case, after releasing the external force acting on the upper metal panel 36, by the elastic force of the upper metal panel 36 itself, each tongue 36c is subject to a moment in the direction of lifting up the corresponding projecting piece 37c. By this, each tongue 36c does not merely touch by engaging with each corresponding projecting piece 37c, but also be connected firmly by a certain biassing force (elastic force of the upper metal panel 36).

Then, a tapered portion of the engaging opening 36h of each tongue 36c is combined with a tapered part of the neck portion 37d of the corresponding projecting piece 37c, and they can slide mutually. By this, they can be engaged surely as scatters in mutual dimensions and shapes are being absorbed.

Figure 18:
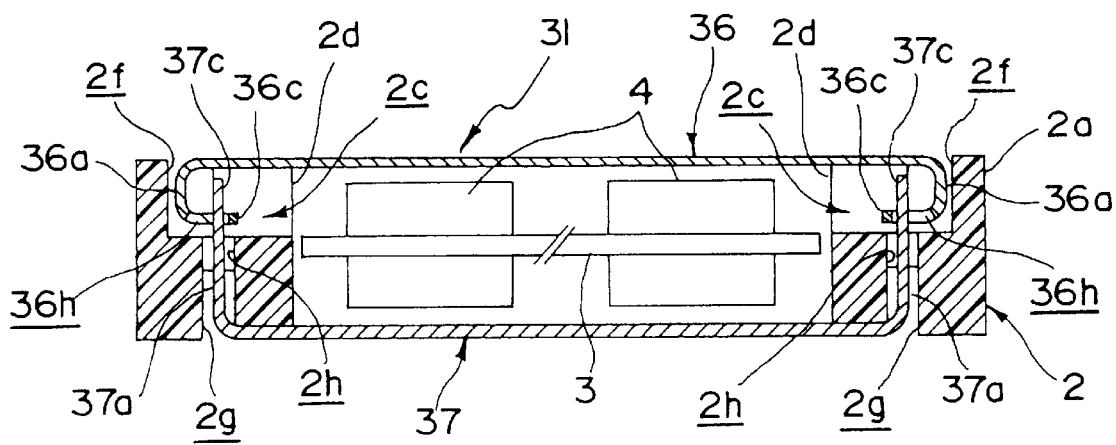
FIG. 18 is a vertical cross-sectional view of the IC card illustrates an engaging condition of tongue and projecting piece in the third embodiment of the invention.

As understood well from FIG. 18, the engaging portion between them is contained in each concavity 2c formed in the longitudinal frame portion 2a of the frame 2. Also, in this moment, the reverse side of the upper metal panel 36 is supported by the upper surface of each convexity 2d formed in the longitudinal frame portion 2a.

As explained above, in this embodiment, the same advantages as those in the first embodiment is obtained basically, and especially, since each projecting piece 37c of the lower metal panel 37 is formed to be a waisted configuration having a neck portion 37d, and the tapered part of the engaging opening 36h provided to each tongue 36c of the upper metal panel 36 engages with the neck portion 37d, when they engage with each other, it is possible to obtain an engaged condition by acting the elastic force of the metal panels, after inserting each projecting piece 37c of the lower metal panel 37 into the wide area of the tapered part. And, it is possible to engage the upper metal panel 36 with the lower metal panel 37 for fixation without applying immoderate force on the upper metal panel 36.

In the next place, the fourth embodiment of the invention, illustrated in FIG. 19–FIG. 22, will be explained.

Figure 19:
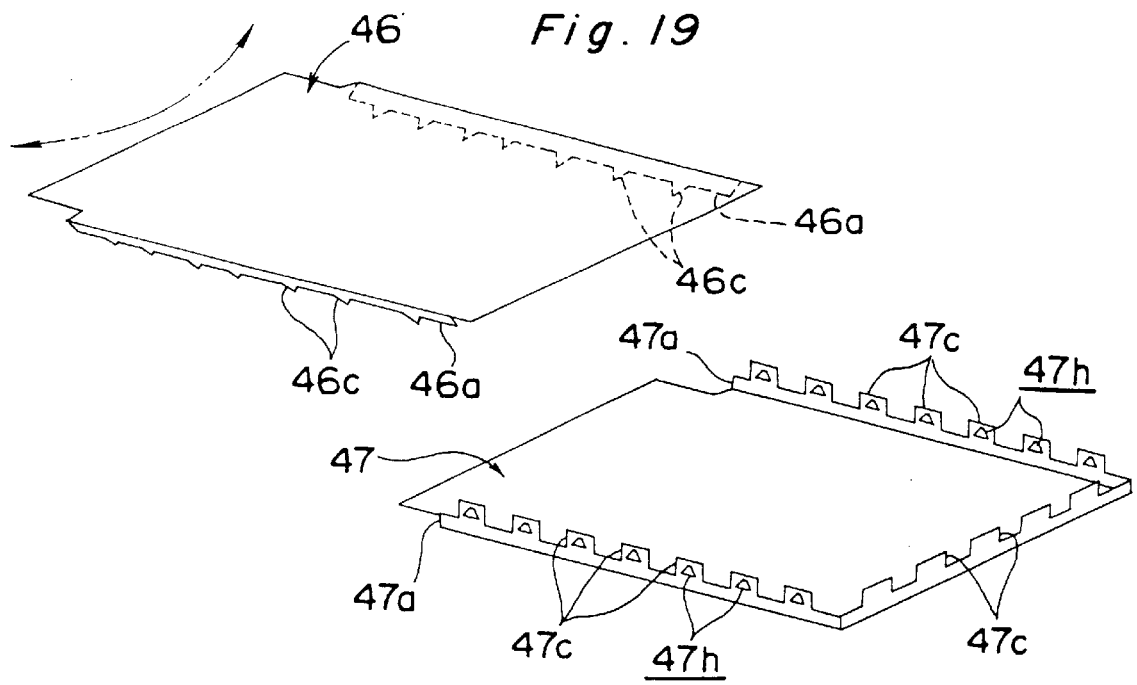
FIG. 19 is an overall perspective view of upper and lower metal panels of the IC card in a fourth embodiment of the invention.

As shown in FIG. 19, in this embodiment, on each longitudinal side edge portion of the upper metal panel 46, a bent portion 46a formed by bending the panel material oblique-inwardly is provided. And, at a plurality of places (seven places in this embodiment), such generally triangle tongues 36c which project inwardly are formed in the same inclined plane as that bent portion 46a.

Figure 20:
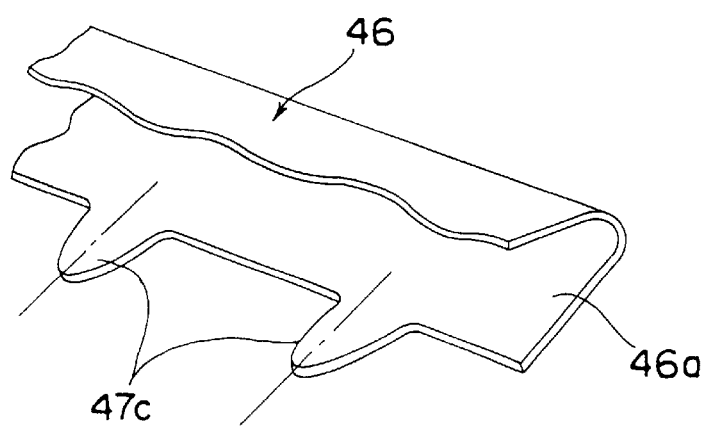
FIG. 20 is an enlarged perspective view of tongues of an upper metal panel of the IC card in the fourth embodiment of the present invention.

In this case, as shown in detail in FIG. 20, since the bent portion 46a and the tongues 46c are designed to be in a same plane, it is not required to divide the bending work of the panel material into two steps, and working process can be simplified.

On the other hand, regarding to a lower metal panel 47, a bent portion 47a formed to be L-shape in a cross-sectional configuration by bending the panel material at about 90 degrees is provided to each longitudinal side edge portion of the lower metal panel 37. That is to say, the bending angles of the upper metal panel 46 and the lower metal panel 47 are different from each other.

And, on the side edge portion of the bent portion 47a of the lower metal panel 47, at a plurality of places corresponding to the tongues 46c of the upper metal panel 46, generally rectangular projecting pieces 47c which project upwardly from the bent portion 47a are provided. And, as understood well from FIG. 21, triangle shaped engaging openings 47h which engage the tongues 46c of the upper metal panel 46 are formed respectively in the projecting pieces 47c.

In the lower metal panel 47, more preferably, a bent portion 47a of L-shape in cross sectional configuration as same as said bent portion 47a and a plurality of projected pieces 47c are formed also on rear side edge portion, however, the above-mentioned engaging openings are not provided in the projecting pieces 47c of this portion.

Also, the plastic frame of the IC card according to this embodiment has the same constitution as that in the first embodiment, though it is not shown concretely in the figure.

And, by pressing each projecting piece 47c of the lower metal panel 47 into the slit 2h of the frame 2 (refer to FIG. 21, FIG. 22) in the same manner as in the first embodiment, the lower metal panel 47 is fixed to the frame 2.

Figure 21:
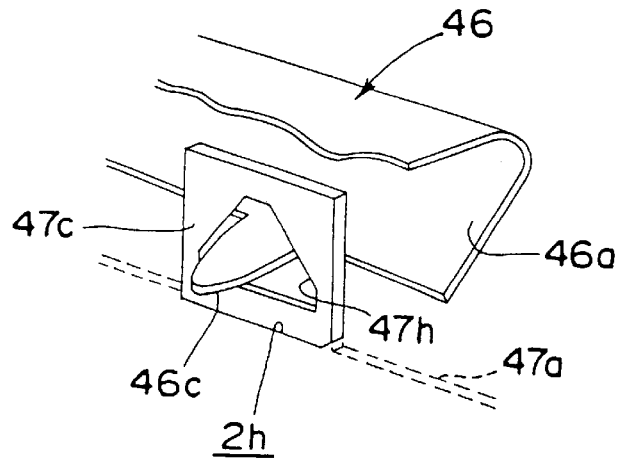
FIG. 21 is an enlarged perspective view illustrates an engaging condition of tongue and projecting piece in the fourth embodiment of the present invention.

After pressing the lower metal panel 47 for fixation to the plastic frame 2, as mentioned above, in engaging the upper metal panel 46 for securing to the lower metal panel 47 in the final step of assembling the IC card 41, as shown by an arrow of virtual lines in FIG. 19, by applying a predetermined external force on the upper metal panel 46, bend the upper metal panel is incurvated within the elasticity of the material thereof, in such a manner as lifting up each longitudinal side edge portions against the middle area, in other words, as expanding the middle area downwardly. By this, the distance between the tongues 36c of both the side edge portions is enlarged. And, in this incurvated condition, as shown in FIG. 21, each tongue 46c of the upper metal panel 46 is to be engaged with the engaging opening 47h of the corresponding projecting piece 47c of the lower metal panel 47. And thereafter, the external force applied on the upper metal panel 46 is to be released.

Thus, each tongue 46c of the upper metal panel 46 engages with the engaging opening 47h of the corresponding each projected piece 47c of the lower metal panel 47, and, the direct contact between the upper and lower metal panels 46, 47 is achieved.

Furthermore, in this case, after releasing the external force acting on the upper metal panel 46, by the elastic force of the upper metal panel 46 itself, each tongue 46c is subject to a moment in the direction of lifting up the corresponding projected piece 47c. By this, each tongue 46c does not merely touch by engaging with each corresponding projected piece 47c, but also be connected firmly by a certain biassing force (elastic force of the upper metal panel 46).

Then, a tapered part of each tongue 46c is combined with a tapered part of the engaging opening 47h of the corresponding projecting piece 47c, and they can slide mutually. By this, they can be engaged surely as scatters in mutual dimensions and shapes are being absorbed.

Figure 22:
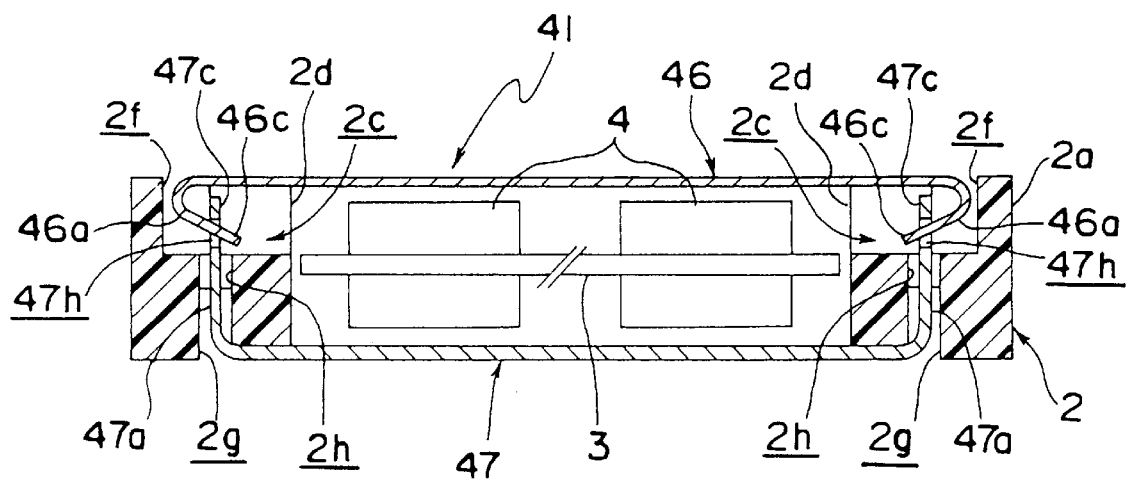
FIG. 22 is a vertical cross-sectional view of the IC card illustrates an engaging condition of tongue and projecting piece in the fourth embodiment of the invention.
Figure 23:
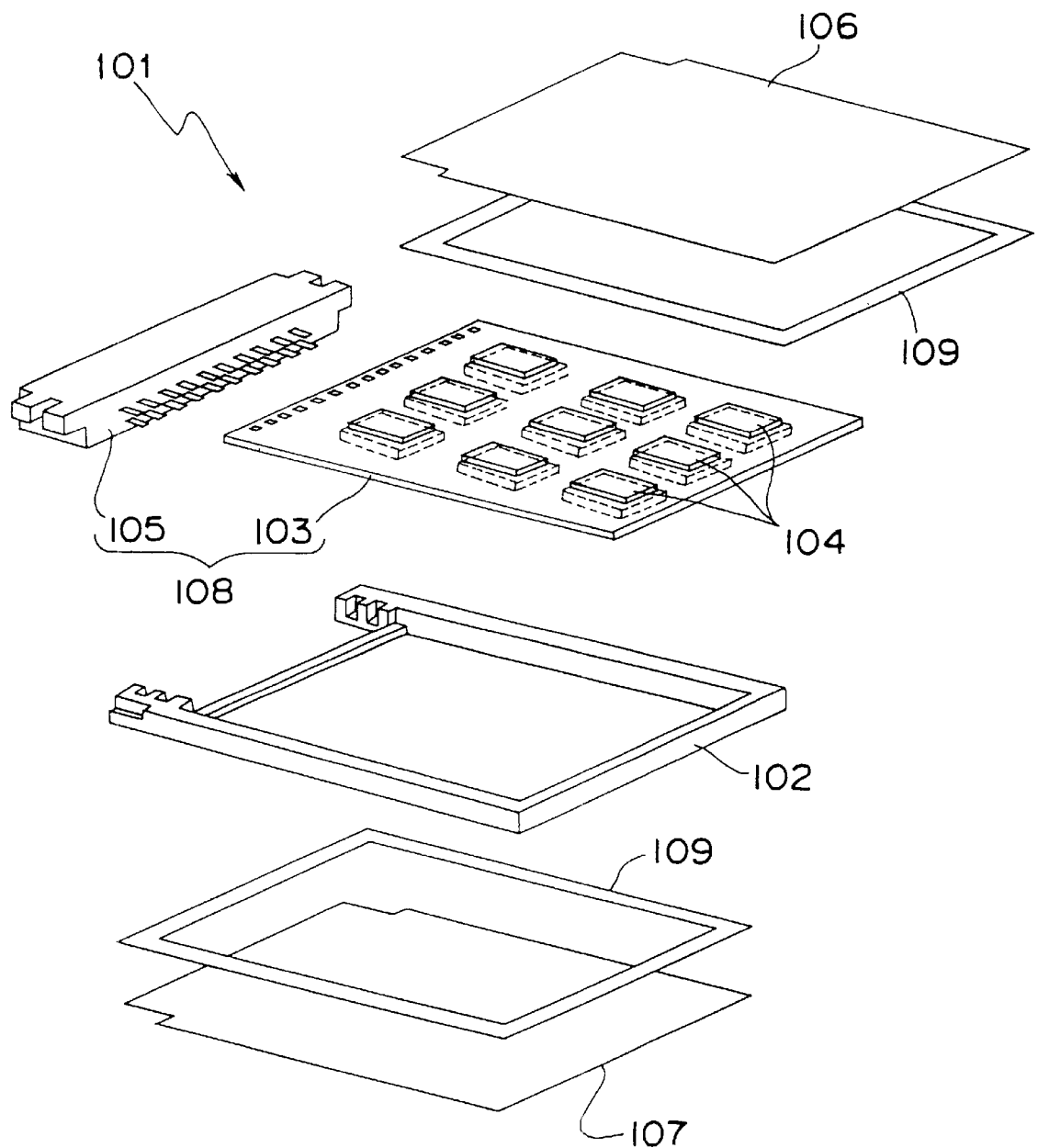
FIG. 23 is a disassembled perspective view of a conventional IC card.
Figure 24:
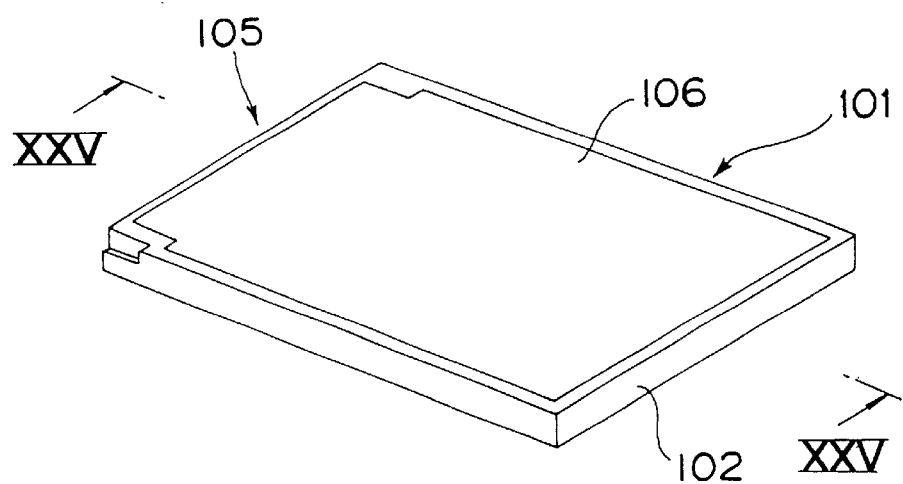
FIG. 24 is an overall perspective view of the conventional IC card.
Figure 25:
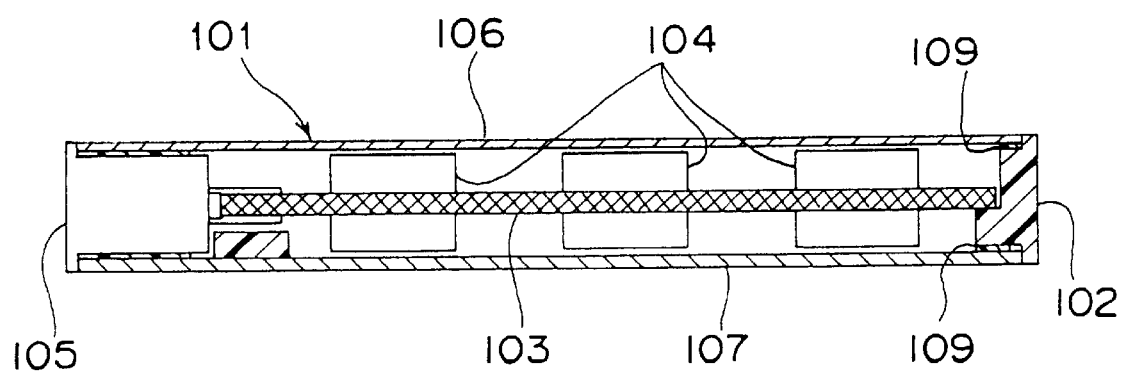
FIG. 25 is a vertical cross-sectional view of FIG. 24 as taken along line XXV—XXV.

As understood well from FIG. 22, the engaging portion of them is contained in each concavity 2c formed in the longitudinal frame portion 2a of the frame 2. Also, in this moment, the reverse side of the upper metal panel 46 is supported by the upper surface of each convexity 2d formed in the longitudinal frame portion 2a.

As explained above, in this embodiment, the same advantages as those in the first embodiment is obtained basically, and especially, since the bent portions 46a of the upper metal panels 46 are bent at a different angle from the bent portions 47a of the lower metal panel 47, and the projecting pieces 46c project additionally from the edge of the bent portions 46a in the same plane, the bent portions 46a and the projecting piece 46c are in the same plane, therefore, in bending the upper metal panel 46, it is not necessary to bend the panel material in divided two stages, and working process can be simplified.

The invention is not limited within the foregoing embodiments, and, it is to be understood that the various kind of improvements and the alternation in design is possible in the scope of the invention.

What is claimed is:

1. An IC card comprising an electrical circuit board in which at least one electronic component is incorporated, a connector to be connected to an end portion of the electrical circuit board, a frame which constitutes an outer frame of the IC card and a pair of metal panels which cover obverse and reverse sides of the IC card, wherein a plurality of projections being able to engage with each other are provided on side edge portions of each metal panel, while, a plurality of slits into which the projections are to be pressed are provided to the frame, and the projections of said one metal panel are pressed into the slits, also, corresponding projections of the outer metal panel are engaged with the projections of said one metal panel respectively in a condition of being subject to elastic force of the metal panels.

2. An IC card according to claim 1, wherein said one metal panel covers the reverse side of the IC card and the other metal panel covers the obverse side of the IC card, and the projections of the other metal panel are engaged with the corresponding projections of said one metal panel from out side.

3. An IC card according to claim 1, wherein a notch opening in a direction along a plane of the IC card is provided to each projection of said one metal panel, and each projection of the other metal panel engages with the notch, by sliding the other metal panel along a corresponding surface of the frame.

4. An IC card according to claim 1, wherein an engaging portion having tapered parts is provided respectively to each projection of both the metal panels.

5. An IC card according to claim 1, wherein on the side edge portions of each metal panel, bent portions formed along the side edge by bending a panel material at a predetermined angle are provided, and the projections of each metal panel are formed so that they project additionally from an edge of the bent portion.

6. An IC card according to claim 1, wherein concavities which contain the engaging portion between the projections of both the metal panel and convexities which can support the other metal panel in an engaging condition thereof are provided.

7. An IC card according to claim 2, wherein an engaging portion having tapered parts is provided respectively to each projection of both the metal panels.

8. An IC card according to claim 2, wherein the side edge portions of each metal panel, bent portions formed along the side edge by bending a panel material at a predetermined angle are provided, and the projections of each metal panel are formed to project additionally from an edge of the bent portion.

9. An IC card according to claim 2, wherein concavities which contain the engaging portion between the projections of both the metal panel and convexities which can support the other metal panel in an engaging condition thereof are provided.

10. An IC card according to claim 3, wherein the notch opens toward a reverse side of a portion of the IC card at which the connector is positioned, and a maximum slide length of the other metal panel is determined to be less than a width of the connector.

11. An IC card according to claim 3, wherein an engaging portion having tapered parts is provided respectively to each projection of both the metal panels.

12. An IC card according to claim 3, wherein on the side edge portions of each metal panel, bent portions formed along the side edge by bending a panel material at a predetermined angle are provided, and the projections of each metal panel are formed so that they project additionally from an edge of the bent portion.

13. An IC card according to claim 3, wherein concavities which contain the engaging portion between the projections of both the metal panel and convexities which can support the other metal panel in an engaging condition thereof are provided.

14. An IC card according to claim 4, wherein each projection of said one metal panel is formed to be a waisted configuration having a neck portion and the tapered part of the engaging portion provided to each projection of the other metal panel engages with the neck portion.

15. An IC card according to claim 4, wherein on the side edge portions of each metal panel, bent portions formed along the side edge by bending a panel material at a predetermined angle are provided, and the projections of each metal panel are formed so that they project additionally from an edge of the bent portion.

16. An IC card according to claim 4, wherein concavities which contain the engaging portion between the projections of both the metal panel and convexities which can support the other metal panel in an engaging condition thereof are provided.

17. An IC card according to claim 5, wherein the bent portions of both the metal panels are bent by mutually different angles, and the projections of each metal panel project additionally from the edge of the bent portions in the same plane.

18. An IC card according to claim 5, wherein concavities which contain the engaging portion between the projections of both the metal panel and convexities which can support the other metal panel in an engaging condition thereof are provided.

* * * * *